United States Patent
King et al.

(10) Patent No.: US 7,141,973 B2
(45) Date of Patent: Nov. 28, 2006

(54) MAGNETIC RESONANCE EXPERIMENTS BY SPATIAL ENCODING USING THE RF TRANSMISSION COIL

(75) Inventors: Scott King, Winnipeg (CA); Lizann Bolinger, Winnipeg (CA)

(73) Assignee: National Research Council of Canada, Ottawa (CA)

( * ) Notice: Subject to any disclaimer, the term of this patent is extended or adjusted under 35 U.S.C. 154(b) by 0 days.

(21) Appl. No.: 10/916,640

(22) Filed: Aug. 12, 2004

(65) Prior Publication Data

US 2005/0099178 A1    May 12, 2005

(51) Int. Cl.
*G01V 3/00* (2006.01)

(52) U.S. Cl. .................. 324/314; 324/309; 324/307

(58) Field of Classification Search ............ None
See application file for complete search history.

(56) References Cited

U.S. PATENT DOCUMENTS

| | | | | |
|---|---|---|---|---|
| 6,229,309 | B1 * | 5/2001 | Aldefeld ................ | 324/314 |
| 6,556,010 | B1 * | 4/2003 | Van Den Brink et al. .. | 324/309 |
| 6,566,877 | B1 * | 5/2003 | Anand et al. ............. | 324/314 |
| 6,791,323 | B1 * | 9/2004 | Wang et al. .............. | 324/309 |
| 6,828,790 | B1 * | 12/2004 | Katscher et al. .......... | 324/318 |
| 2002/0011845 | A1 * | 1/2002 | Van Den Brink et al. .. | 324/322 |
| 2003/0057946 | A1 * | 3/2003 | Shah et al. ............... | 324/307 |
| 2003/0102866 | A1 * | 6/2003 | Katscher et al. .......... | 324/318 |
| 2003/0214291 | A1 * | 11/2003 | Gurr et al. ............... | 324/307 |
| 2005/0099178 | A1 * | 5/2005 | King et al. .............. | 324/309 |

* cited by examiner

Primary Examiner—Diego Gutierrez
Assistant Examiner—Tiffany A. Fetzner
(74) Attorney, Agent, or Firm—Adrian D. Battison; Michael R. Williams; Ryan W. Dupuis

(57) ABSTRACT

In a method of spatial encoding in magnetic resonance experiments, encoding kernels are imposed into the magnetization signal during the excitation or re-focussing process using a transmit array coil. Separate transmit array coil elements are provided so that in a particular phase encode direction, z in this case, they can be driven to produce partially orthogonal B1 fields, $T_t(r)$, that exhibit a Fourier phase distribution given by $$T_t(r)=T_0 e^{i(k_t^T z)}=T_0 e^{i(t\Delta k_z z)}.$$

The NMR signal, $S_m(k_n)$, received by a coil array element m of the M receive coils, during application of a pulse sequence for the n-th phase encoding step in k-space is then given by $$S_m(k_n)=\int dr \rho'(r) e^{i(k_n \cdot r)} C_m(r)$$

such that $$\rho'(r)=\rho(r)T_t(r)=\rho(r)T_0 e^{i(t\Delta k_z z)}$$

where $k_n$ is the $n^{th}$ spatial encoding k-space trajectory for the spatial dimension r, $C_m(r)$ is the receive coil sensitivity, and $\rho'(r)$ represents the magnetization spatial distribution arising from the spin density spatial distribution $\rho(r)$, the pulse sequence and the transmit array excitation/re-focussing phase profile. It is clear that using an appropriately driven transmit array capable of producing the $t^{th}$ phase encode term, gradient phase encode steps may be eliminated.

17 Claims, 8 Drawing Sheets

COS(t Δk z) = COS(4 2π/FOV z)

MAGNETIC RESONANCE EXPERIMENTS BY SPATIAL ENCODING USING THE RF TRANSMISSION COIL

This invention relates to a method of effecting magnetic resonance experiments where the RF transmission coil is used to spatially encode the signal as a replacement for or a supplement to applying steps in the magnetic field gradients.

BACKGROUND OF THE INVENTION

Fast Magnetic Resonance Imaging (MRI) and Chemical Shift Imaging (CSI) require both high signal to noise ratio (SNR) as well as fast data acquisition. These fast imaging techniques are critical in imaging moving parts of the body such as cardiac imaging, one of the largest growing applications of MRI. The development of partially parallel imaging (PPA) methods such as SENSE and SMASH have made it possible to collect image data 2–3 times faster than before when combined with an optimized phased array coil. A new area is to apply these reduced phase encode methods to CSI which traditionally has been plagued by long acquisition times.

The speed up factors currently available are typically 2 or 3. The demand for faster imaging is so great that the ability to produce speed up factors of 5 or 6 would be huge.

There are also applications where movement is such a problem that faster acquisitions are still not able to produce acceptable results, such as kinetic knee studies. In these cases, the fact that B0 field gradients are used at all makes some applications inconceivable. If we could not only increase the speed up factor of PPA, but also collect data without the use of spatial encoding gradients, the applications would be limitless.

According to present technology, the NMR signal, $S_m(k_n)$, received by a coil array element m of the M receive coils, during application of a pulse sequence for the n-th phase encoding step in k-space is given by $$S_m(k_n) = \int dr \rho(r) e^{i(k_n \cdot r)} C_m(r),$$

where $k_n$ is the $n^{th}$ spatial encoding k-space trajectory for the spatial dimension r, $C_m(r)$ is the receive coil sensitivity, and $\rho(r)$ represents the magnetization spatial distribution arising from the spin density spatial distribution, the pulse sequence and the transmit excitation profile. This is the standard form of the Fourier transform relating the time domain or k-space signal $S_m(k_n)$ to the frequency domain of spatial signal $\rho(r)$. Traditionally in MRI, the encoding function or kernel $f(k,r)$ of this transformation is the exponential function, that is, $$f(k_n, r) = e^{i(k_n \cdot r)},$$

where, $S_m(k_n) = \int dr \rho(r) f(k_n, r) C_m(r)$

The k-space trajectory is generated with magnetic field gradients in the x, y or z directions. For 2D imaging, only two orthogonal directions are used with the third direction used for slice selection. Without loss of generality, suppose that for a y-z image, the phase encoding is taken to be in the z-direction. Then after Fourier transformation in the frequency encode direction (y), the above equation in this hybrid space becomes, $$S_m(y, k_n) = \int dz \rho(y, z) e^{i(n \Delta k_z z)} C_m(r),$$

where $\Delta k_z$ is the separation between k-space lines relating to the Field-Of-View (FOV) of the image, $n \in [0,N]$ where N defines the resolution in the phase encode dimension (z).

If k-space is incompletely sampled by skipping phase encode lines, effectively increasing $\Delta k_z$, then image reconstruction will result in wrapping or fold-over artifacts due to a smaller FOV in the phase encode dimension.

It is well known that if the M-array coil sensitivities are partially orthogonal in the phase encode direction, then the missing phase encode lines can be recovered with proper combination of the resulting wrapped images in the time domain using a technique known as SMASH D. K. Sodickson, W. J. Manning, Simultaneous Acquisition of Spatial Harmonics (SMASH): Fast Imaging with Radiofrequency Coil Arrays, Magn. Reson. Med. 38:591–603 (1997), or unwrapped in the image domain using a technique known as SENSE K. P. Pruessmann, M. Weiger, M. B. Scheidegger, P. Boesiger, SENSE: Sensitivity Encoding for Fast MRI, Magn. Reson. Med. 42:952–962 (1999), using this orthogonal knowledge of the coil sensitivities. The term partially orthogonal is used in the context that the coil sensitivities $C_m$, at wrapping pixel locations partially differ in their magnitude and/or phase distributions from each other along the phase encode direction.

One example of this would be box functions spanning different spatial locations in the phase encode direction (magnitude partial orthogonality). Another example would be traditional birdcage-field and spiral birdcage fields in which case the transverse B1 phase gives rise to orthogonal B1 in the phase encode direction (phase partial orthogonality).

The SMASH version is explained in the time domain as follows. Suppose, the M-receive coil sensitivities $C_m(r)$ for $m \in [0,M]$, are partially orthogonal in the phase encode direction, z, such that $$C_m(k_m, r) = C_0 e^{i(k_m^R z)} = C_0 e^{i(m \Delta k_z z)}.$$

In this simplified case, each receive coil is capable of producing a different order-m of the k-space lines. That is, the coil sensitivity function can be included into the Fourier transform kernel, such that $$f_C(k_p, r) = e^{i(k_n \cdot r)} C_m(k_m^R, r),$$

$$S_m(k_p) = \int dr \rho(r) f_C(k_p, r)$$

For every acquired phase encode line n ($n \in N$), the p=n+m phase encode line can also be generated without actually acquiring the p-phase encode line of data. Purposely making the missing phase encode lines the p-phase encode lines, all of k-space can be filled in for a reconstructed image with no wrapping artefact. Because the N+M lines are achieved with only N-applications of the pulse sequence, a time saving is achieved by the factor 1/R, where R=M is called the reduction factor. What this also means is that for $m \in [0,M]$, M phase encoding steps can be achieved without the use of any gradient phase encoding steps (n=0).

The SENSE version is explained in the image domain as follows. Suppose every $R^{th}$ phase encode step is skipped producing M-array images with R-fold wrapping. This means that R-pixels along the phase encode direction are superimposed onto one in the wrapped images. For the m-array coil element, the $p^{th}$ pixel value ($S^m_p$) is given by the sum of the wrapped pixels each weighted by the m-array coil element sensitivity at the wrapped pixel location, q. This is given by $$S_p^m = \sum_{q=1}^{R} s_q C_q^m,$$

or in matrix form,

S=sC.

Here S is an M×1 vector, s is a 1×R vector and C is an R×M matrix. The true (unwrapped) pixel values, $s_q$, can be obtained by solving for s.

As mentioned above, with current 4–8 channel receiver MRI systems, the present solutions can only achieve 2–3 fold speed-up factors and also still use B0 field gradient encoding.

SUMMARY OF THE INVENTION

It is one object of the present invention to provide an improved method of effecting magnetic resonance experiments.

According to the invention there is provided a method of effecting magnetic resonance experiments on a sample comprising:

providing a magnet and operating the magnet to define a magnetic field;

locating the sample in the magnetic field;

providing a transmit RF coil array and applying an energizing signal to the transmit coil array to excite magnetization within the sample;

receiving RF signals from the sample;

and analyzing the RF signals received from the sample to determine information relating to the sample;

wherein the magnetization signal is excited or re-focussed using an RF pulse from said tx-array such that, along a selected direction relative to the B0-field, the tx-array imposes a particular phase distribution to the magnetization signal as to produce a transform kernel associated with the spatial encoding method to form a magnetic resonance image.

According to one advantageous operation, this method can be used to replace gradient phase encode steps while still maintaining proper image reconstruction by spatial encoding into the excited magnetization signal.

The phase encode direction described herein is the z direction of the magnetic field but this is not essential and other directions may be selected including an oblique direction at some angle to the x, y and z directions.

In the most effective technique, the transmit array comprises an array of multiple coil elements and there is provided a method of delivering power (magnitude and phase controlled) to the separate array elements.

The Tx-array and power delivery are preferably arranged to produce sinusoidal/cosinusoidal or Fourier magnitude/phase B1 distributions in the direction of the spatial encoding, but other magnitude/phase B1 distributions may also be selected to effectively produce other encoding kernels such as Hadamaard or wavelet encoding.

The power may be supplied by a single transmitter delivering power to the multi-element array using a switchable power splitter controlled to deliver power to the appropriate array element. Alternatively separate transmitters can be used.

Preferably the gradient field is varied to provide a series of N gradient steps and additional encoding sequence acquisitions are obtained using the spatially encoded excited or re-focussed magnetization signal with the same N-gradient steps, applied to achieve the N+T phase encode steps.

This is particularly effective when used in a method in which the receive coils collect multi-echo SE images with echoes created by applying each successive re-focussing RF pulse with successive Tx-array Fourier B1-phase distributions by appropriate power delivery to each Tx-array coil element.

Preferably the transmit array is arranged to have an intrinsic sine/cosine phase/magnitude modulation along the phase encoding direction.

Separate transmit array coil elements are provided so that in the phase encode direction, z, they produce partially orthogonal B1 fields, $T_t(r)$ for t $\in$[0,T], that exhibit a Fourier phase distribution given by $$T_t(r) = T_0 e^{i(k_t^T z)} = T_0 e^{i(t\Delta k_z z)}$$

Here, in this Transmit/Receive SMASH description, N+M+T phase encode steps are achieved with only N gradient phase encode variations if T transmit phase encoding steps are employed. This can be described mathematically as, $$S_m(k_p) = \int dr \rho(r) T_t(k_p,r) e^{i(k_n \cdot r)} C_m(k_m, r),$$

or, $S_m(k_p) = \int dr \rho(r) f_{TC}(k_p,r)$ where a new Fourier transform kernel is defined as, $$f_{TC}(k_p) = T_t(k_p,r) e^{i(k_n \cdot r)} C_m(k_m,r)$$

such that in the phase encoding dimension, $$S_m(y,k_p) = \int dz \rho(y,z) e^{i(K_t^T z)} e^{i(k_n z)} C_0(y,z) e^{i(K_m^T z)},$$

or, $S_m(y,k_p) = \int dz \rho(y,z) e^{i(t\Delta k_z z)} e^{i(n\Delta k_z z)} C_0(y,z) e^{i(m\Delta k_z z)}.$ What this means is that for t $\in$[0,T], and m $\in$[0,M], T+M phase encoding steps could be achieved without the use of any gradient phase encoding steps (n=0). Alternatively, for N gradient phase encoding steps, N(T+M) phase encoding steps are achieved.

At least two methods exist for using the transmit-array encoding in this description. The first method uses additional encoding sequence acquisitions with the same $n^{th}$-gradient step, applied to achieve the $n^{th}+t^{th}$ phase encode steps. This therefore does not allow time saving because for each of the transmit phase encode steps, the sequence must be applied and data collected. The second version acts to collect multi-echo SE images with echoes created by applying each successive re-focussing RF pulse with successive Tx-array Fourier B1-phase distributions by appropriate power delivery to each Tx-array coil element. In this case, time saving is achieved over standard single echo imaging because the transmit-coil phase encoding occurs during one sequence application. Time saving over multi-echo imaging is also achieved using tx-array spatial encoding because time associated with application of particular re-focussing gradients is eliminated and sequence timing is compressed for improved temporal resolution. Because certain field gradient steps are not played out, nerve stimulation effects associated with fast switching times is also reduced. Careful attention should be paid to the accumulated phase at different pixel positions.

BRIEF DESCRIPTION OF THE DRAWINGS

One embodiment of the invention will now be described in conjunction with the accompanying drawings in which.

DETAILED DESCRIPTION

Figure 1:
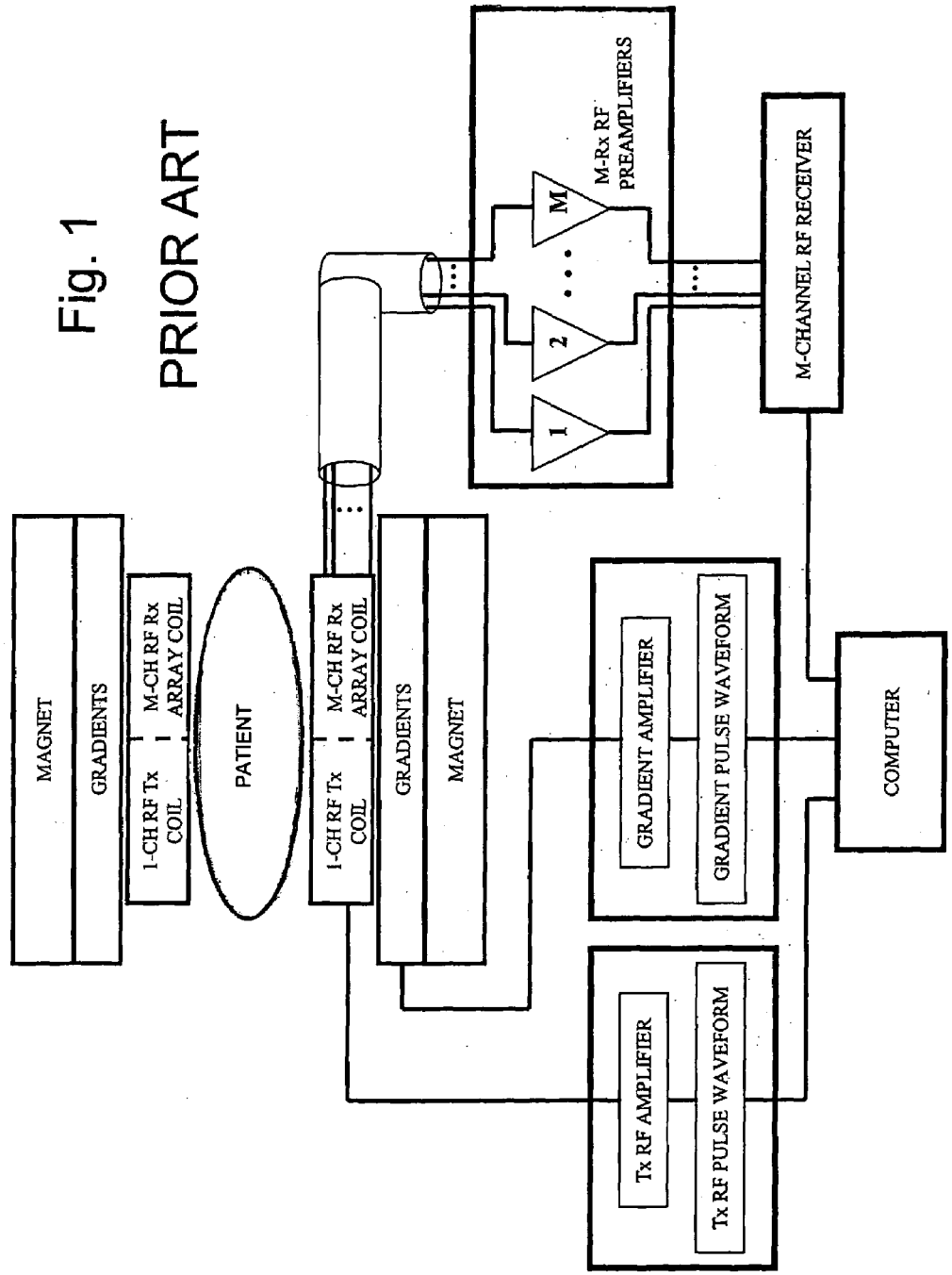
FIG. 1 is a schematic illustration of a typical PRIOR ART apparatus for use in multiple channel receive Magnetic Resonance experiments.

The standard PRIOR ART clinical MRI system shown in FIG. 1 contains a single transmitter (Tx modulator and Tx amplifier), and multiple receivers for use with a multi-element phased array RF Rx-coil (FIG. 1). This standard multi-channel MRI system is required for Rx-array coil spatial encoding such as SENSE and SMASH as described in the references identified above.

Figure 2:
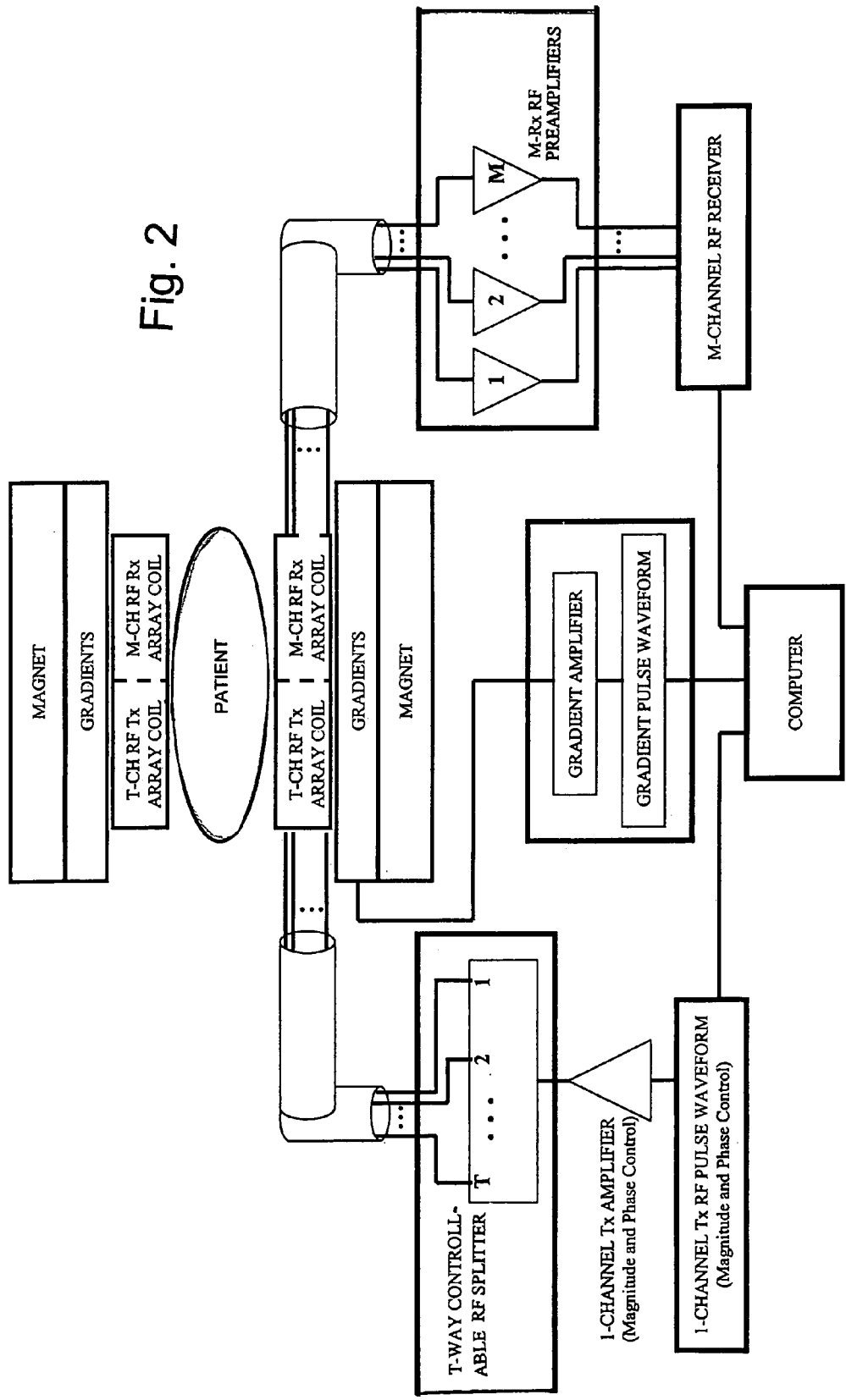
FIG. 2 is a schematic illustration of an apparatus for use in a first method according to the present invention of single channel transmit and multiple channel receive Magnetic Resonance experiments.
Figure 3:
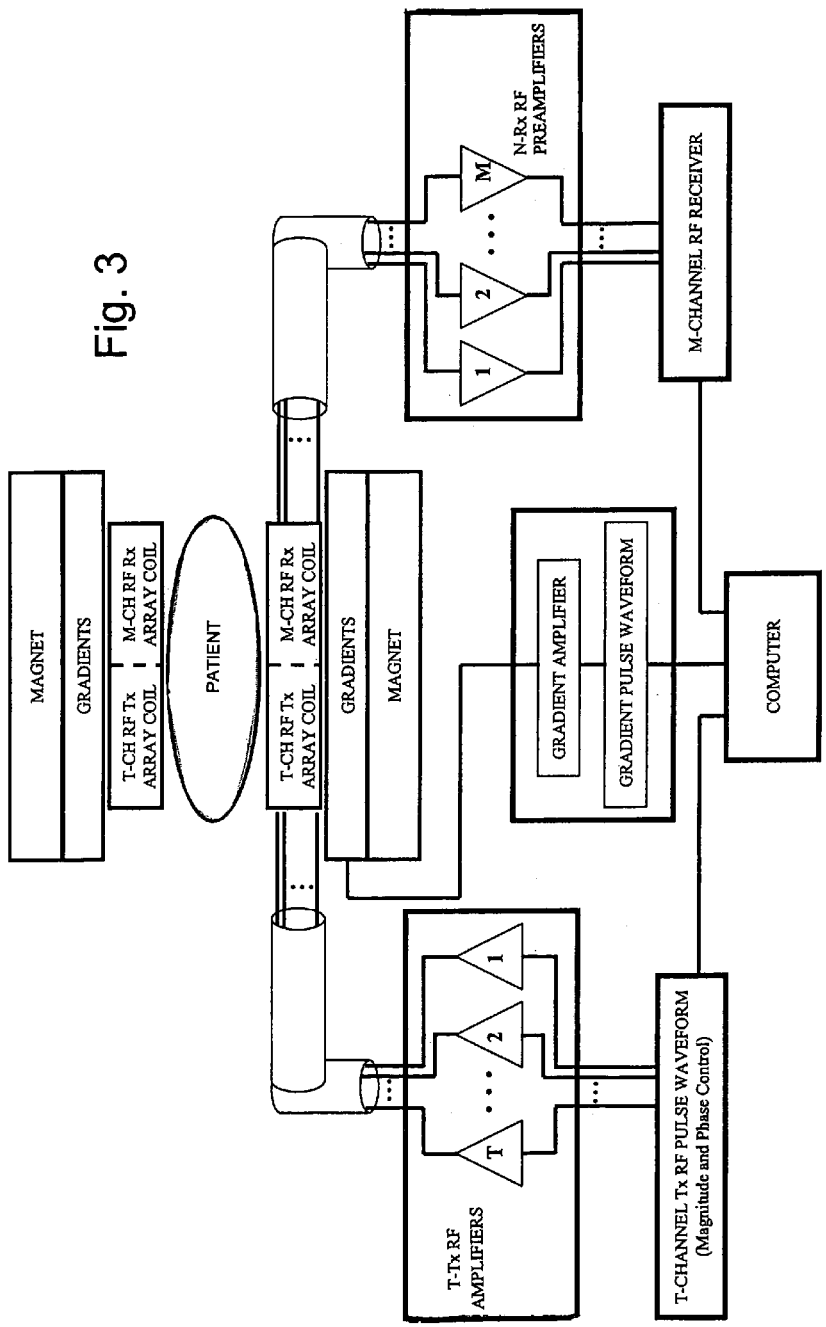
FIG. 3 is a schematic illustration of an apparatus for use in a second method according to the present invention of multiple channel transmit and multiple channel receive Magnetic Resonance experiments.
Figure 4A:
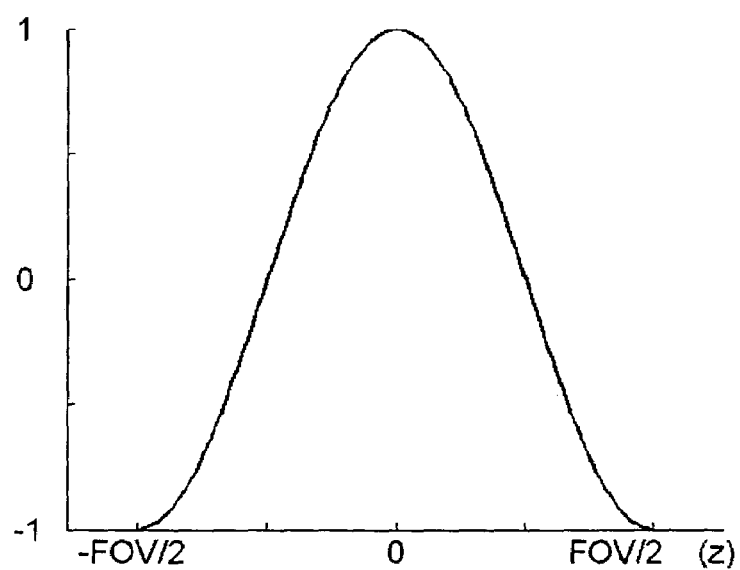
FIGS. 4A, 4B, 4C and 4D show series of graphs showing a desired spatial encoding for a series of coil elements of the transmit array for use in the methods of FIGS. 2 and 3.
Figure 4B:
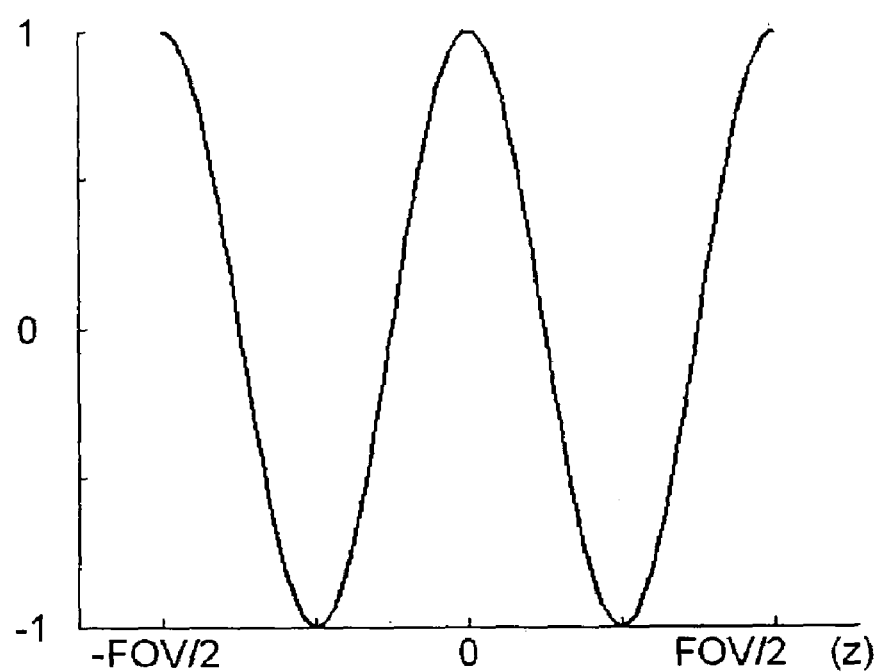
Figure 4C:
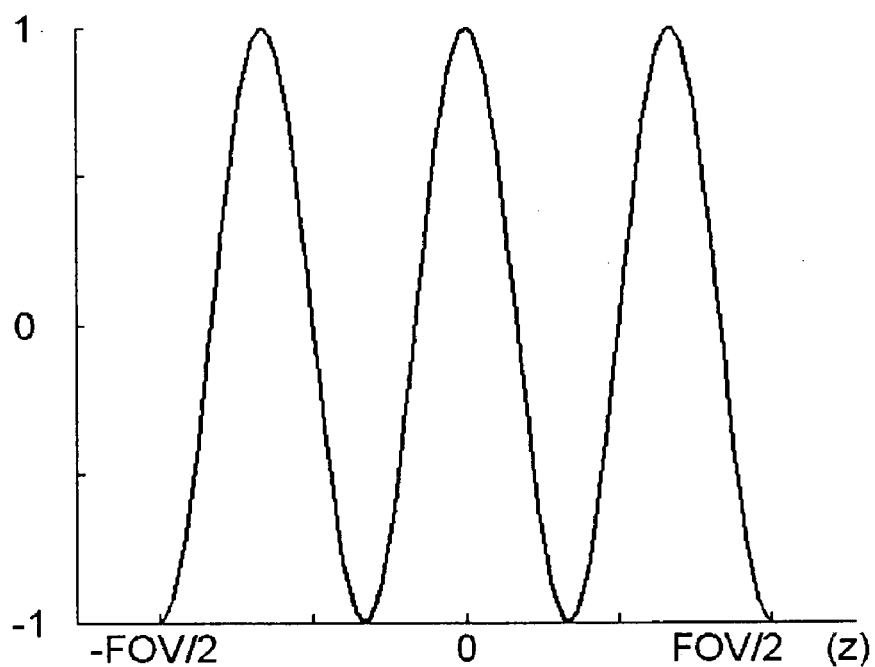
Figure 4D:
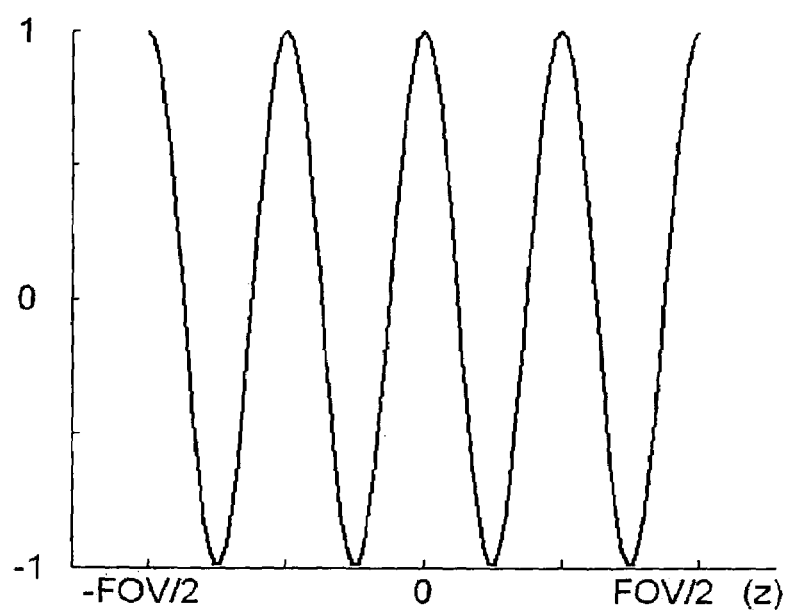

In the Tx-spatial encoding method, the MRI system would include a RF Tx array coil consisting of an array of multiple coil elements and a method of delivering power (magnitude and phase controlled) to the separate Tx array elements as shown in FIG. 2 and FIG. 3.

In Fourier encoding MR Imaging, the encoding function (kernel) is a complex exponential function with exponent or phase term linear in position, gradient strength and gradient length. The linear magnetic field gradient produces sinusoidal/cosinusoidal varying spatial frequency distributions within the sample. Therefore, elements of the Tx-array would need to be driven in such a way to produce sinusoidal/cosinusoidal magnitude/phase B1 distributions in the direction of the Tx spatial encoding (FIG. 4). This is accomplished through a superposition of B1 fields from individual array elements. The phase and magnitude coefficients required for each array element in the superposition is dependent on the desired sine/cosine B1 field harmonic being produced and an experimentally determined magnitude/phase B1-map for each of the array elements. During a further set-up procedure, it may be necessary to perform so called B1 shimming whereby additional fine adjustments are made to the weighting coefficients to achieve optimal B1 magnitude/phase distributions associated with a particular spatial harmonic encoding.

Two methods could be used to deliver power to the multi-Tx array.

The first most general method is to have separate Tx amplifiers delivering appropriate power (magnitude and phase controlled) to the separate Tx array elements as shown in FIG. 2 at the same time during a particular RF pulse to produce the desired B1 phase encoding kernel during excitation.

The second method is to have a single transmitter delivering power to the multi-Tx array using a switchable power splitter, that could be manually or automatically (passive or active) controlled to deliver appropriate power to each array element as shown in FIG. 3.

There can be several different Tx-array configurations.

Figure 5:
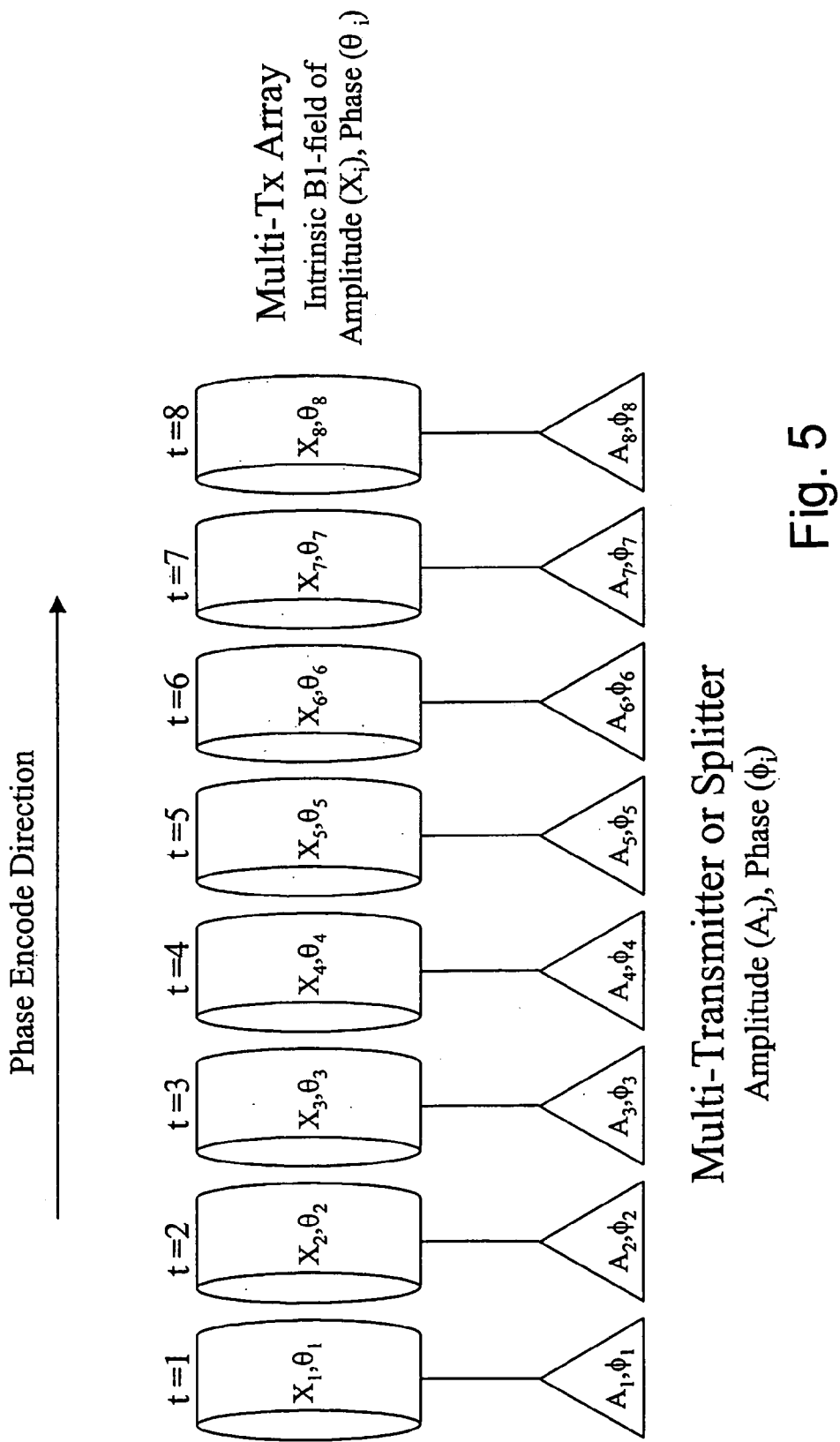
FIG. 5 is a schematic illustration of a coil array for use in the methods of FIGS. 2 and 3.

One configuration is a series of elements placed along the phase encoding direction as shown in FIG. 5, each with an intrinsic B1-field magnitude and phase, that is driven with appropriate driving magnitudes and phases to produce the required encoding function/kernel. Another embodiment has Tx array elements stacked around a conical section which can be cylindrical, ellipsoidal, spherical, possibly not symmetrical in all dimensions. Another embodiment has a mesh or array elements formed over the conical section described above. Another embodiment has substantially overlapped array elements each covering most of a conical surface described above with substantially overlapping B1 fields over the volume of interest that may or may not be well decoupled from each other. In all cases, a map of the B1 magnitude/phase distribution for each array element is required to determine the appropriate weighting coefficients for producing particular spatial harmonics or encoding steps.

In a specific situation where each of the Tx-array elements is capable of producing a desired spatial harmonic (kernel) for the desired spatial encoding as shown in FIG. 4, power (during RF pulse excitation or re-focussing) is delivered to successive Tx array elements for successive phase encodes and thus a single transmitter is used with a switch that controls which Tx-array element is used at what time. Such array elements have an intrinsic sine/cosine phase/magnitude modulation along the phase encoding direction. The spiral birdcage array with specified twist angle such as 0°, 180°, 360°, also can be used which produces such Fourier encoding phase modulations.

Other encoding functions can also be used (such as wavelet encoding) requiring that elements of the Tx-array need to be excited in such a way to produce orthogonal magnitude/phase B1 distributions associated with the particular encoding kernel used in the imaging process. In such cases Tx-array coils are designed specially for these applications, and may be designed to have an intrinsic magnitude/phase B1 distribution associated with a non-Fourier encoding function such as wavelet encoding methods.

Some uses:

1) Complete, non-B0 gradient phase encoding can be achieved by combining Receive- and Transmit-coil spatial encoding 2) Low Resolution CSI: It is reasonable to think that a non-gradient phase encode method could be achieved for a small number of voxels which in normal CSI would result in voxel bleed due to non-optimal point spread function.

3) By having re-focussing and spatial phase encoding accomplished during the RF re-focussing pulse period, gradient phase encode steps are removed, so that pulse sequences such as the turbo spin echo sequence could be shortened and hence the number of echoes collected within a TR period, before re-excitation, could be increased thus achieving faster imaging times.

4) Motion insensitive MRI/MRS. In this case, spatial encoding with the multi-Tx coil and Rx coil arrays would replace gradient phase encoding, making the data much less susceptible to motion artifacts. Speed of acquisition would not necessarily be the focus of these experiments.

5) 3D imaging using multi-Tx spatial encoding into the third dimension using standard Fourier Tx-array spatial encoding or Tx-array alternative encoding such as Hadamaard encoding.

Since various modifications can be made in my invention as herein above described, and many apparently widely different embodiments of same made within the spirit and scope of the claims without department from such spirit and scope, it is intended that all matter contained in the accompanying specification shall be interpreted as illustrative only and not in a limiting sense.

The invention claimed is:

1. A method of effecting magnetic resonance experiments on a sample comprising:
   operating a magnet to define a magnetic field;
   locating the sample in the magnetic field;
   providing a transmit RF coil tx-array and applying an energizing signal to the transmit coil array to excite magnetization within the sample;
   receiving RF signals from the sample;
   and analyzing the RF signals received from the sample in received k-space to form a magnetic resonance image based upon an image transform kernel;
   wherein the magnetization signal is excited or re-focussed by a series of sequential B1 fields;
   generating each B1 field by an RF pulse applied to the transmit array;
   each B1 field having a phase which varies spatially according to a predetermined phase distribution with the spatial distribution of each B1 field being different relative to the spatial distribution of the previous B1 field;
   and selecting the phase distribution of the B1 fields in a selected encoding direction relative to the B0 field in dependence upon the image transform kernel so that the magnetization signal traverses through receive k-space.

2. The method according to claim 1 wherein the magnet includes gradient coils with gradient coil phase encode steps and wherein at least some gradient phase encode steps are replaced while still maintaining proper image reconstruction by spatial encoding into the excited magnetization signal.

3. The method according to claim 1 wherein the direction is the z direction of the magnetic field.

4. The method according to claim 1 wherein the transmit array comprises an array of multiple coil elements and wherein power is delivered to each of the separate array elements as required to generate said predetermined phase distribution.

5. The method according to claim 1 wherein the method is arranged to produce non-Fourier phase B1 distributions in the direction of the spatial encoding to form a magnetic resonance image through non-Fourier transformation.

6. The method according to claim 1 wherein the method is arranged to produce Fourier sinusoidal/cosinusoidal phase B1 distributions in the direction of the spatial encoding to form a magnetic resonance image through Fourier transformation.

7. The method according to claim 1 wherein the method is arranged to produce wavelet phase B1 distributions in the direction of the spatial encoding to form a magnetic resonance image through a wavelet transform.

8. The method according to claim 1 wherein the B1 fields are arranged such that each has substantially constant magnitude.

9. The method according to claim 4 wherein there is provided a single transmitter delivering power to the multi-element array using a switchable power splitter controlled to deliver power to the appropriate array element.

10. The method according to claim 4 wherein there is provided a plurality of transmitters each delivering power to a respective one of the coil elements of the multi-element array.

11. The method according to claim 1 wherein the gradient field is varied to provide a series of N gradient steps and additional encoding sequence acquisitions are obtained using the tx-array to provide further spatial encoding into the magnetization signal with the same N-gradient steps, applied to achieve N+T phase encode steps.

12. The method according to claim 1 wherein the transmit array element is arranged to have an intrinsic non-Fourier sine/cosine B1 phase modulation along the phase encoding direction.

13. The method according to claim 1 wherein the transmit array element is arranged to have an intrinsic wavelet B1 phase modulation along the phase encoding direction associated with a particular wavelet encoding method.

14. The method according to claim 1 wherein the transmit array element is arranged to have an intrinsic Fourier sine/cosine B1 phase variation along the phase encoding direction.

15. A method of effecting magnetic resonance experiments on a sample comprising:
   operating a magnet to define a magnetic field;
   locating the sample in the magnetic field;
   providing a transmit RF coil tx-array and applying an energizing signal to the transmit coil array to excite magnetization within the sample;
   receiving RF signals from the sample;
   and analyzing the RF signals received from the sample in received k-space to form a magnetic resonance image based upon an image transform kernel;
   wherein the magnetization signal is excited or re-focussed from a series of sequential B1 fields;
   generating each B1 field by an RF pulse applied to the transmit array;
   each B1 field having a phase which varies spatially according to a predetermined phase distribution with the spatial distribution of each B1 field being different relative to the spatial distribution of the previous B1 field;
   and selecting the phase distribution of the B1 fields in a selected encoding direction relative to the B0 field in dependence upon the image transform kernel so that the magnetization signal traverses through receive k-space;
   wherein multi-echo SE images are collected with echoes created by applying each successive re-focusing RF pulse with successive Tx-array Fourier B1-phase variations.

16. A method of effecting magnetic resonance experiments on a sample comprising:
   operating a magnet to define a magnetic field;
   locating the sample in the magnetic field;
   providing a transmit RF coil tx-array and applying an energizing signal to the transmit coil array to excite magnetization within the sample;
   receiving RF signals from the sample;
   and analyzing the RF signals received from the sample in received k-space to form a magnetic resonance image based upon an image transform kernel;
   wherein the magnetization signal is excited or re-focussed by a series of sequential B1 fields;
   generating each B1 field by an RF pulse applied to the transmit array;
   each B1 field having a phase which varies spatially according to a predetermined phase distribution with the spatial distribution of each B1 field being different relative to the spatial distribution of the previous B1 field;
   and selecting the phase distribution of the B1 fields in a selected encoding direction relative to the B0 field in dependence upon the image transform kernel so that the magnetization signal traverses through receive k-space;
   wherein the tx-array comprises an array of multiple coil elements each arranged to generate a respective one of the B1 fields;

and wherein the coil elements are shaped such that each by its shape intrinsically generates the required phase distribution.

17. A method of effecting magnetic resonance experiments on a sample comprising:
operating a magnet to define a magnetic field;
locating the sample in the magnetic field;
providing a transmit RF coil tx-array and applying an energizing signal to the transmit coil array to excite magnetization within the sample;
receiving RF signals from the sample;
and analyzing the RF signals received from the sample in received k-space to form a magnetic resonance image based upon a Fourier image transform kernel;
wherein the magnetization signal is excited or re-focussed by a series of sequential B1 fields;
generating each B1 field by an RF pulse applied to the transmit array;
each B1 field having a phase which varies spatially according to a predetermined phase distribution with the spatial distribution of each B1 field being different relative to the spatial distribution of the previous B1 field;

wherein the phase distribution is defined by:

$$T_t(r) = T_0 e^{i(k_t T_r)} = T_0 e^{i(t\Delta k r)},$$

where the transmit field $T_t(r)$ has a substantially constant magnitude, $T_0$, in the phase encoding direction, r, designed to produce $t_{th}$ component of the transform kernel and $\Delta k$ is the phase encode step required for reconstruction over the imaging field-of-view.

* * * * *